United States Patent [19]

Voss

[11] Patent Number: 4,827,376

[45] Date of Patent: May 2, 1989

[54] HEAT DISSIPATING INTERCONNECT TAPE FOR USE IN TAPE AUTOMATED BONDING

[75] Inventor: Scott V. Voss, Portola Valley, Calif.

[73] Assignee: Olin Corporation, New Haven, Conn.

[21] Appl. No.: 134,740

[22] Filed: Dec. 18, 1987

Related U.S. Application Data

[63] Continuation-in-part of Ser. No. 105,141, Oct. 5, 1987.

[51] Int. Cl.[4] .............................................. H05K 7/20
[52] U.S. Cl. .................................... 361/388; 361/421; 29/827; 206/330; 428/573
[58] Field of Search ............... 428/572, 573; 29/827; 174/68.5, 52 PE, 52 FP; 165/80.3, 185; 206/328, 329, 330, 331, 820; 361/398, 421, 383, 386, 387, 388, 401, 403, 414

[56] References Cited

U.S. PATENT DOCUMENTS

| | | | |
|---|---|---|---|
| 3,611,061 | 10/1971 | Segerson | 428/572 |
| 3,802,069 | 4/1974 | Thompson | 29/827 |
| 3,821,847 | 7/1974 | Melse | 29/827 |
| 4,209,355 | 6/1980 | Burns . | |
| 4,234,666 | 11/1980 | Gursky . | |
| 4,385,202 | 5/1983 | Spinelli et al. . | |
| 4,394,530 | 7/1983 | Kaufman | 361/388 |
| 4,410,927 | 10/1983 | Butt . | |
| 4,449,165 | 5/1984 | Kaufman | 361/421 |
| 4,474,292 | 10/1984 | Tehrani | 206/329 |
| 4,514,750 | 4/1985 | Adams | 174/52 FP |
| 4,524,238 | 6/1985 | Butt . | |
| 4,607,276 | 8/1986 | Butt . | |
| 4,656,499 | 4/1987 | Butt . | |
| 4,684,975 | 8/1987 | Takiar et al. . | |
| 4,704,187 | 11/1987 | Fujita | 357/70 |

OTHER PUBLICATIONS

"TAB Technology Tackles High Density Interconnections" by Tom Dixon, *Electronic Packaging & Production*, Dec. 1984, pp. 34–39.
"Future Packages' Heat Transfer Will Affect PCB Designs" by Ernel R. Winkler, *Electronic Packaging & Production*, Apr. 1985, pp. 104–109.
"Advanced Packaging for VLSI" by Charles J. Bartlett, *Solid State Technology*, Jun. 1986, pp. 119–123.
"Microelectronic Packaging" by Albert J. Blodgett, Jr., *Scientific America*, Jul. 1983, pp. 86–96.

Primary Examiner—Gerald P. Tolin
Attorney, Agent, or Firm—Gregory S. Rosenblatt; Paul Weinstein

[57] ABSTRACT

The present invention is directed to electronic packages. A heat dissipating pad positioned over the electrically active face of an electronic device transfers heat from the device to the electronic package or to an external heat sink. A dielectric electrically isolates the heat dissipating pad from the electronic device.

23 Claims, 5 Drawing Sheets

HEAT DISSIPATING INTERCONNECT TAPE FOR USE IN TAPE AUTOMATED BONDING

This application is a continuation-in-part of U.S. patent application Ser. No. 105,141 filed 10-5-87 entitled, "HEAT DISSIPATING INTERCONNECT TAPE FOR USE IN TAPE AUTOMATED BONDING" by S. H. Butt et al. and assigned to a common assignee.

This invention relates to an improved heat dissipating interconnect tape for use in tape automated bonding (hereinafter referred to as TAB). Integrated circuits made from semiconductor materials are increasing in size, operating speeds and circuit density. The packaging for these electronic devices must adapt to meet the improvements. Two areas in which electronic packages must be adapted are to support the increased number of bonding sites on the chip and increased power generated by the increased size and circuit density.

One way to address the increased circuit density is the use of TAB instead of conventional wire bonding. TAB permits closer spacing of interconnect bonding pads on a semiconductor die than would be achievable by wire bonding. A general review of TAB technology is set forth in an article entitled "TAB Technology Tackles High Density Interconnections" by Tom Dixon, which appeared in the December, 1984, volume of *Electronic Packaging & Production*, at pages 34–39.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect generally comprises a plurality of narrow leads arranged to extend outwardly from a semiconductor die such that the inner lead portions are adapted to be bonded to the semiconductor die contact pads and the outer lead portions are adapted to bond to a lead frame, circuit board, etc. as desired. In the single layer version, a metal frame supports the elongated leads; whereas in the two or three layer versions, a polyimide substrate supports the leads.

The TAB process involves first bonding the inner lead portions of the TAB tape to the semiconductor device followed by excising the leads from the tape frame or support substrate and then bonding the outer lead portions to the desired lead frame, package circuitry or printed circuitry, as desired. The TAB leads are formed from a metal foil, such as copper foil and are relatively thin, typically about ½ to about 6 mils thick. The thinness of the TAB foil permits the interconnects to be placed more closely together thereby allowing high density interconnection at the semiconductor chip.

TAB tapes may be bumped or unbumped. The bumps act in part as mechanical standoffs from the chip. Unbumped tapes require that the semiconductor chips be bumped in order to make the desired thermal compression bond between the inner lead portion of the TAB leads and the chip. Bumped tape eliminates the need for bumping of the wafer and permits the TAB interlead bond portions to be bonded directly to ordinary semiconductor die bonding pads. The bumped tape normally has a copper projection bump positioned at the point where it is to be joined to the die. This bump may, if desired, be covered with a suitable plating such as gold, tin or nickel.

The second area in which electronic packages require adaptation is thermal dissipation. A general review of the thermal dissipation requirements for electronic packaging may be found in the articles entitled "Future Packages' Heat Transfer Will Affect PCB Designs", by Ernel R. Winkler, which appeared in the April, 1985, volume of *Electronic Packaging & Production* at pages 104–109, and "Advanced Packaging For VLSI", by Charles J. Bartlett, which appeared in the June, 1986, volume of *Solid State Technology*, at pages 119–123.

A key objective in designing an electronic package is to limit the chip temperature to a maximum acceptable value. When an electric current is passed through the chip, the current encounters a certain amount of resistance. This resistance results in the generation of heat. It follows that the more circuits on the chip, the greater the heat generation. It is also known that a 10° C. rise in chip temperature typically reduces the chip lifetime by about 50%. Ideally, the chip temperature should be maintained below about 85° C.

Bartlett gives several formulas which quantify the factors which determine the operating temperature of the chip. The chip junction temperature is a function of the power generated by the chip minus the heat dissipated by the package. There are essentially three routes for heat dissipation: by conduction through the base of the chip, by conduction through the leads, and by conduction, convection, or radiation through the face of the chip.

Most semiconductor devices have circuitry located on one face of the semiconductor chip. The chip is usually silicon although the use of germanium or gallium arsenide is also known. A variety of physical and chemical processes are employed to form the desired integrated circuit structure on this face. As electric current passes through the circuitry, heat is generated. Many different mechanisms to remove the heat have been proposed. For example, U.S. Pat. No. 4,410,927 to Butt illustrates several electronic package embodiments with heat sinks incorporated into the package base. U.S. Pat. No. 4,385,202 to Spinelli et al. illustrates printed circuit boards to which a semiconductor package may be mounted. Running through the circuit board is a heat sink means. The aforementioned article by Winkler illustrates several heat sink means.

A common mechanism runs through the above-mentioned heat sink methods. All consist of a heat sink means located either at or below the interface of the package base and the semiconductor device. As heat is generated at the electrically active face a finite amount of time is required for the heat to pass through the thickness of the semiconductor chip and usually a substrate material before reaching the heat sink for transportation away from the device.

Heat is removed from the active face of the semiconductor die by convection through air. To improve heat dissipation by convection, forced air has been used as have gases other then air. For example, the article entitled, "Microelectronic Packaging" by Albert J. Blodgett, Jr., in the July, 1983, volume of *Scientific American*, at Pages 86–96 shows the use of helium which has a higher convective heat transfer coefficient than air.

The leads have been utilized as conductive heat sinks. U.S. Pat. No. 4,684,975 to Takiar et al. discloses metal tape leads which extend inward from the bonding pads to remove heat from the central regions of a semiconductor device.

Yet another means to improve heat dissipation is shown in U.S. Pat. No. 4,524,238 to Butt where the package lid is in direct contact with the chip or alternatively, a thermally conductive spring extends from the lid to make contact with the chip. Another thermal dissipation method is disclosed in the U.S. Patent to Butt, U.S. Pat. No. 4,607,276 in which a spring device is affixed to the base of the package and acts as a grounding contact for the semiconductor device and also pushes the chip against the package lid to create a thermal dissipation path.

The manufacture of tapes for tape automated bonding (TAB) is well known and illustrated in U.S. Pat. No. 4,209,355 to Burns and U.S. Pat. No. 4,234,666 to Cursky. The advantages of TAB interconnect tapes for high density packages are well described in the aforementioned article by Dixon.

The aim of the present invention is to provide an interconnect tape and electronic packaging means whereby the number of interconnects may by increased and the corresponding increased heat generated will be removed by an effective means of thermal dissipation.

It is an advantage of the present invention to apply a thermal dissipation means which is in contact with the heat generating face of the chip.

It is another advantage of the present invention to provide a thermal dissipation means which is incorporated within the interconnect tape, and thermally isolated from the leads.

It is another advantage of the present invention to use the interconnect tape to improve thermal dissipation of TAB packaging.

It is yet another advantage of this invention to provide for the use of TAB tape to improve the thermal dissipation of a molded plastic electronic package.

Accordingly, there has been provided an interconnect tape for use in tape automated bonding with a heat dissipating pad positioned on the heat generating face of a semiconductor chip. The interconnect tape is comprised of at least one electrically conductive strip; at least one lead pattern in the strip including at least one cluster of leads which have free ends that project toward the center of the cluster and opposite ends supported by said strip; a heat dissipating pad spaced apart from and centrally of the free ends of said leads; and at least one support member extending outward from said heat dissipating pad and affixed to the electrically conductive strip.

In another embodiment, the heat dissipating pad is not a component of the lead pattern containing TAB tape, rather formed from a second tape which is positioned on the heat generating face of the semiconductor chip either prior to or subsequent to TAB or wire bonding of the chip.

These and other aims will become more apparent from the following description and drawings in which like elements have been given like reference numbers and in which prime or multiprime numbers comprise similar elements providing similar functions.

BRIEF DESCRIPTION OF THE DRAWINGS

FIG. 1 illustrates prior art. An interconnect tape 10 contains a plurality of leads 11 the leads have an inner end portion 12 for connection to an electronic device, typically a semiconductor die and an outer end portion 15 for connection to a leadframe or other method of making contact with the outside world. Index holes 16 are used to align the interconnect tape for automated bonding to semiconductor chips according to well known means. The leads are usually quite narrow to permit a high density of interconnects. The leads are susceptible to distortion during assembly. To prevent bending, a tie bar 14 is often used to keep the leads straight. The tie bars may be fashioned from the interconnect tape or, in the alternative, be fashioned from polymer rings, not shown, in accordance with conventional TAB technology. Once the interconnect tape is in position relative to a semiconductor package, the leads are separated from the tape carrier by, for example, a cutting or stamping operation. Additionally, the tie bar is removed from the leads.

FIG. 2 illustrates a prior art electronic package adapted to house a semiconductor device utilizing one method for removing heat from the device. A semiconductor device 17 also known as a die is enclosed in an electronic package comprised of a package base 18 and a package cover 20. Heat is removed through the package base via a heat sink 19 and through the chip face by convection currents in the air 21 sealed within the package.

The package base is usually made from a ceramic or metal material with a coefficient of thermal expansion approximately the same as the coefficient of thermal expansion of the semiconductor device, for example aluminum oxide or Alloy 42. The base material is usually a poor conductor of heat. The heat sink is usually a material with high thermal conductivity such as copper or aluminum. Since the heat sink materials generally have coefficients of thermal expansion much larger than the semiconductor device, the device is usually not affixed directly to the heat sink.

Figure 3:
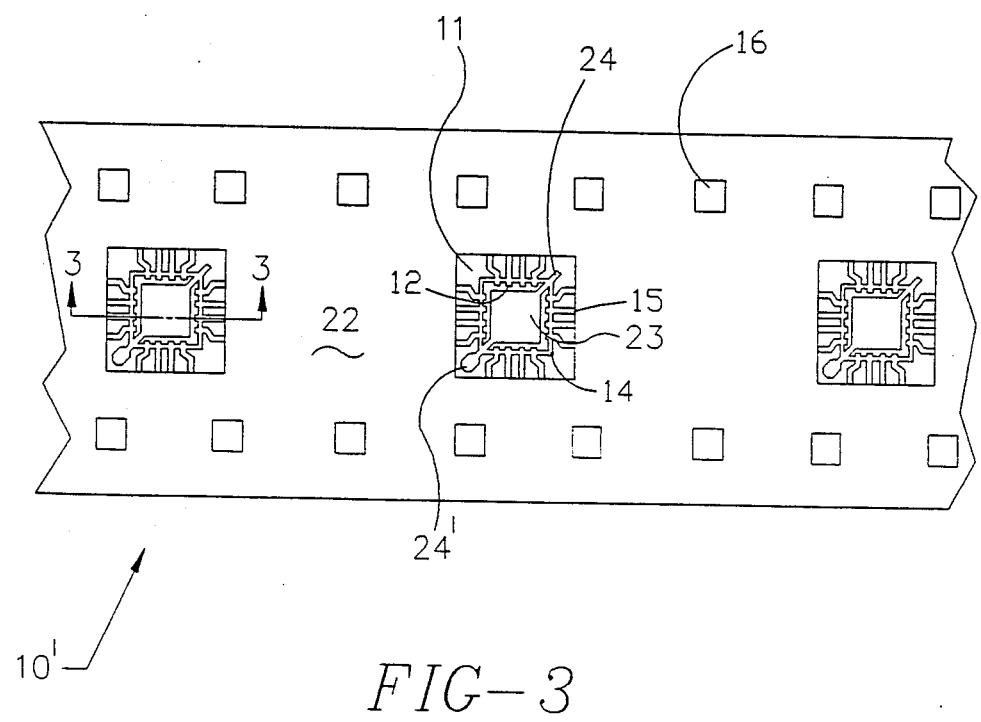
FIG. 3 is a schematic representation of the interconnect tape in accordance with the present invention.
Figure 2:
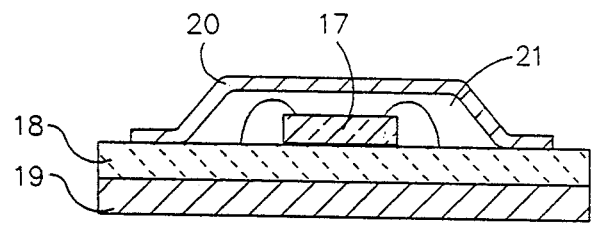
FIG. 2 is a schematic representation of an electronic package incorporating a heat sink means in the base of the semiconductor package.

FIG. 3 is a schematic representation of the interconnect tape 10' claimed in the present invention. At least one electrically conductive strip 22 with at least one lead pattern within the strip including at least one cluster of leads 11 which have free end portions 12 that project toward the center of the cluster and opposite end portions 15 supported by the strip. A heat dissipating pad 23 is spaced apart from and positioned centrally of the inner end portion 12 of said leads. There is at least one support member 24 extending outward from the heat dissipating pad which is held in place by the tie bar 14.

In accordance with the present invention the leads 11, the heat dissipating pad 23 and the support members 24 are all fabricated from the same electrically conductive strip 22. The strip is generally fabricated of a formable material of relatively high thermal conductivity, for example, a copper or copper based alloy. The strip thickness ranges up to about 0.01 inches and preferably from about 0.0005 inches to about 0.006 inches. The interconnect tape may be a single-layer metal or metal alloy or it may be a multi-layer laminate. The laminate has at least one electrically conductive layer bonded to at least one electrically insulating layer.

The lead pattern 11, the heat dissipating pad and the support members 24 are formed by a known process, such as a selective chemical etch or photolithography. If the interconnect tape is homogeneous, such as solid copper, a tie bar 14 is formed by the same process. The formed parts are supported by a surrounding electrically conductive strip 22. Once the leads are bonded to a semiconductor device, the electrically conductive strip and tie bar are excised by stamping or an equivalent process.

If the interconnect tape 10' is a laminate, for example, a three layer laminate comprising two copper layers separated by a non-conductive polyimide layer or a five layer laminate comprised of the same three layers bonded together by adhesive layers, the leads are formed from one copper layer and the heat dissipating pad and the support members are formed from the second copper layer. A tie bar is not necessarily required as the leads are supported by the polyimide layer. The leads are bonded to a semiconductor die and the electrically conductive strip is removed.

As discussed hereinbefore, the leads of a tape package have been used to conduct heat from the electrically active face of a semiconductor device. Heat is a form of energy and is absorbed by the atoms that make up the heat dissipaters. As the atoms of the leads absorb energy, the electrons surrounding the atoms become more agitated. With increased vibration about the atomic centers, the number of free electrons being reflected or deflected is greatly increased and the electrical conductivity of the leads is decreased. The heat dissipating pad is designed to minimize heat conduction through the leads to maintain the electrical conductivity of the leads.

The support fingers 24' serve to conduct heat away from the heat dissipating pad and the semiconductor device. The heat is transferred from the support fingers to the body of the electronic package or as will be discussed below to an external heat sink or the outside air. The greater the surface area of the support fingers, the greater the ability of those support fingers to transfer heat. To maximize thermal transport, the support fingers are expandable to occupy the available area between adjoining leads.

While FIG. 3 illustrates a continuous web to supply the strip of electrically conductive material, TAB circuitry may also be supplied in the form of sticks of several lead patterns or as single lead pattern sites supplied in a slide like carrier.

Figure 4A:
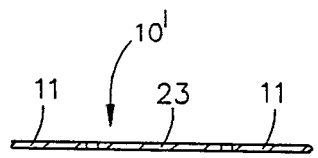
FIG. 4A is a cross-sectional representation of a preferred embodiment showing the position of the heat dissipating pad in relationship to the leads.

FIG. 4A is a cross-sectional representation of a preferred embodiment. The electrically conductive strip 12' is a single layer of a relatively high thermal conduction material, such as homogeneous copper or a copper alloy, which is formed into leads 11 and heat dissipating pad 23.

Figure 4B:
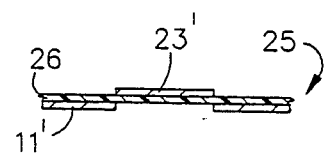
FIG. 4B is a cross-sectional representation of a second embodiment showing the position of the heat dissipating pad in relationship to the leads.

In another preferred embodiment shown in FIG. 4B, the leads 11' and the heat dissipating pad 23' are fabricated from different layers of a multi-layer laminate 25. A first copper or copper based alloy layer 11' and a second copper or copper based alloy layer 23' are separated by a nonconducting layer 26. The first copper or copper based alloy layer is formed into leads by a know technique such as selective photoetching or photolithography and the second copper layer is formed into the heat dissipating pad by a similar or equivalent technique.

Figure 5:
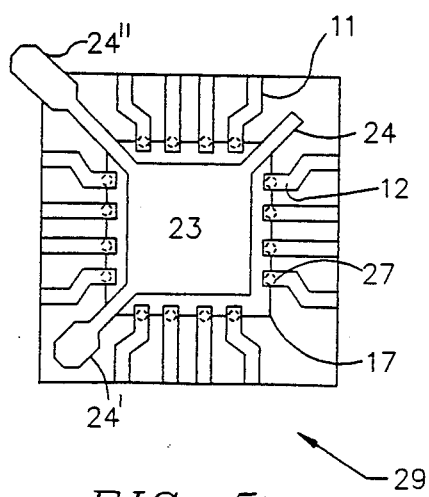
FIG. 5 is a schematic representation of the interconnect tape showing the relationship of the heat dissipating pad to the leads and to a semiconductor device.

FIG. 5 is a schematic representation of the heat dissipating pad 23, in a preferred embodiment, positioned adjacent to the electrically active face of an electronic device 17. The electrically active face is that surface of the semiconductor device in which electronic circuitry has been inserted, usually by a thermochemical reaction such as doping. The inner lead portions 12 terminate at electrically active bonding sites 27 and are attached to the chip by a suitable lead bonding process such as ultrasonic bonding, compression bonding, or thermal compression bonding.

The support fingers 24 are bonded to a package base component 29 by any suitable bonding means. The bonding means may include soldering, welding, simple mechanical contact, or any other method which will keep the support means in a fixed position and in relatively close proximity to the base component.

The thermal dissipation ability of the heat dissipating pad may be further improved by incorporating the support means as a heat spreader. The support means 24' illustrates one such spreader. By increasing the surface area of the support means, more heat may be transferred to the surrounding package. The size and shape of the support means are limited only by the size of the package and the lead position. The support means preferably remains electrically isolated from the leads.

Nothing in the specification is intended to limit the heat spreader to the package interior. 24" shows a possible embodiment in which the support means extend beyond the package boundaries. The external end of the support means may dissipate heat to the environment by convection or by conduction to an external heat sink (not shown).

Figure 6:
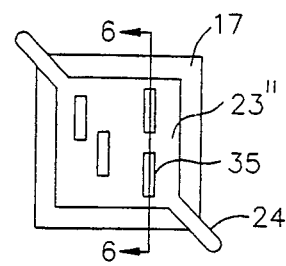
FIG. 6 is a schematic representation of an embodiment showing heat dissipating fins attached to the heat dissipating pad.

FIG. 6 illustrates another embodiment of the present invention. The heat dissipating pad 23″ has heat dissipating fins 35 affixed to the pad and extending outwardly.

The fins serve several functions. First by increasing the effective surface area of the heat dissipating pad, the amount of heat which may be dissipated by convection is increased. Also, the fins extend outward from the heat dissipating pad. A forced air current flowing across the face of the semiconductor device impinges upon the fins increasing the efficiency of heat transfer.

Figure 7:
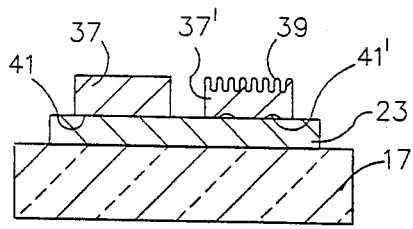
FIG. 7 is a cross-sectional representation along the line 6—6 in FIG. 6 and illustrates the positioning of the fins on the heat dissipating pad.

FIG. 7 shows the positioning of the heat dissipating fins 37 in cross-sectional representation along line 6—6. The fin base 41 is bonded to the heat dissipating pad 23 by conventional means such as soldering or epoxy. The fin base may be continuous or perforated. A perforated base 41′ is useful to reduce stresses in the semiconductor chip induced by the fins and heat dissipating pad as discussed hereinafter.

The fins may be flat or serrated across the non-bonded edge 39. Combing increases the surface area of the fin resulting in improved heat removal. There may be one or more fins, the number and the spacing are dependent upon the heat dissipating requirements of the semiconductor device.

Figure 8:
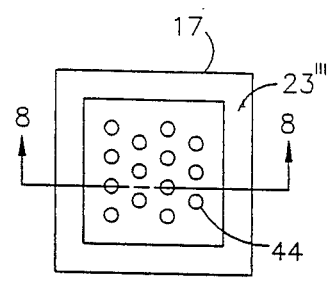
FIG. 8 is a schematic representation of a method to reduce the thermal stresses generated by the heat dissipating pad.
Figure 9:
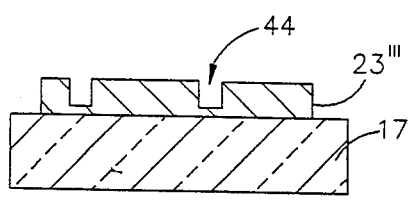
FIG. 9 is a cross-sectional representation along the line 8—8 in FIG. 8 of the method to reduce thermal stresses generated by the heat dissipating pad.

Most materials expand when heated. The expansion rate is dependent upon the material and each material has a distinct coefficient of thermal expansion. The heat dissipating pad, which is preferably composed of a material with a high thermal conductivity such as copper or a copper alloy, will most likely have a significantly higher coefficient of thermal expansion than the semiconductor device. The thermal expansion mismatch may introduce unwanted stresses into the electronic device. It is an embodiment of the present invention to introduce stress relieving members within the heat dissipating pad 23‴ as illustrated in FIG. 8. The stress relieving device may take the form of a series of holes 44. The holes need not be round, rather whatever shape is most effective for stress relief. Any pattern comprised of a plurality of holes may be provided. FIG. 9 is a cross-sectional representation of the heat dissipating pad of FIG. 8 along line 8—8. The means for fabricating stress relief holes are known to the art. One method would be a selective chemical etch. Preferably the holes do not extend through the entire thickness of the heat dissipating pad. Heat dissipation by conduction through the heat dissipating pad 23‴ is more efficient than by convection through the hole 44.

Figure 10:
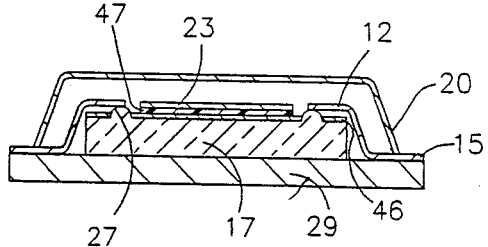
FIG. 10A is a cross-sectional representation of a TAB package incorporating a preferred embodiment of the present invention.
FIG. 10B is a cross-sectional representation of a TAB package incorporating another embodiment of the present invention.
Figure 10:
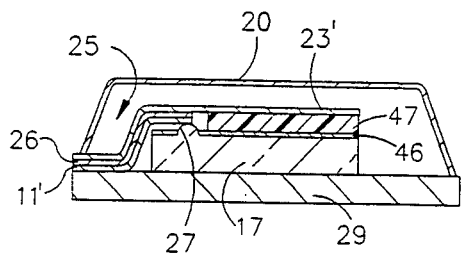

FIG. 10A is a schematic representation of a heat dissipating TAB tape according to the present invention incorporated into a tape package adapted to house an electronic component. The package contains a base component 29 and a cover component 20 bonded to the base component to create an enclosure suitable for housing an electronic device 17. The base component may be a material with a coefficient of thermal expansion close to that of the electronic device such as KOVAR or alloy 42 or a material with high thermal conductivity, such as copper or a copper based alloy. The interconnect tape is disposed between the base component and the cover component. The base component and cover component are bonded together with a suitable insulating material so that outer lead portions 15 are electrically isolated from each other as well as from the package components. A suitable material for a hermetic package is a sealing glass such as those disclosed in U.S. Pat. No. 4,656,499 to Butt. If hermeticity is not a requirement, a polymer chosen from the class consisting of thermosetting and thermoplastic polymer resins may be chosen, for example an epoxy.

The outer lead portion could pass through or terminate at positions along the base or cover such that electrical isolation and contact with the outside world is maintained. A method, not shown, would be to terminate the leads at electrically conductive pads located along a ceramic base component. The pads would be terminations for conductive vias. The vias pass through a ceramic base component to leads or printed circuitry. When the leads do not pass through the base/cover interface, the base may be bonded to the cover with an electrically conductive material, for example, a metallic solder.

The TAB tape contains inner lead portions 12 which are connected to bonding sites 27 of the electronic device. Outer lead portions 15 extend beyond the electronic package for connection to a printed circuit board or other electronic device. The heat dissipating member 23 is affixed to the semiconductor chip by an adhesive 47.

The adhesive may be any compliant thermally conductive material. Stresses generated by a coefficient of thermal expansion mismatch between the electronic device and the heat dissipating pad preferably are absorbed by the adhesive rather than transmitted to the electronic device.

A second consideration is the electrical characteristics of the adhesive. The electronic circuitry is generally located on one face of the electronic device. An electric current passes through this circuitry generating heat which the thermal dissipation pad removes. Thermal dissipation efficiency is improved if the heat dissipating pad physically contacts the heat generating face. It would be detrimental to the operation of the device if electric current could leak from the circuitry to the heat dissipating pad creating an electrical short circuit. The adhesive must have a high dielectric constant. Alternatively, a passivation layer may be utilized. It is known in the semiconductor industry to apply a passivation layer to the face of the semiconductor device. The passivation layer 46 is generally applied by the semiconductor device manufacturer and consists of a thin layer of a nonconducting material, for example, silicon dioxide. The passivation layer covers the entire face of the chip except for the active bonding sites 27 which may be raised bumps as illustrated or flat as described hereinafter. The passivation layer thickness is quite small, so the effectiveness of the heat dissipating pad is not greatly diminished.

If a passivation layer is applied to the active face of the electronic device, the adhesive may be any relatively thermally conductive, deformable, compliant adhesive. The elastic modulus of the adhesive should be kept low to prevent transmission of stresses to the electronic device. Some examples of suitable adhesive materials are silicones or adhesives loaded with a powdered metal, such as silver or copper. Since the adhesive is usually a less effective conductor of heat than the heat dissipating pad, it is generally desired to keep the adhesive layer thickness to a minimum. The adhesive is usually a better conductor of heat than air so a void free layer of adhesive covering the entire heat dissipating pad and chip interface is desirable.

An alternate embodiment is illustrated in FIG. 10B. As in FIG. 10A, a cover component 20 is bonded to a base component 29 with a leadframe 11′ disposed between the cover component and the base component. The cover is bonded to the base component with a suitable sealant. However, in the present embodiment, the leadframe 11' and the heat dissipating pad 23' are part of the same multi-layer laminate 25. The first conductive layer of the laminate is formed into the leads 11' while the second conductive layer is formed into the heat dissipating pad 23'. The two layers are separated by a non-conductor 26 so the heat dissipating pad may be any size or shape desired and there is no danger of creating an electrical short by contact with any of the leads.

Figure 11:
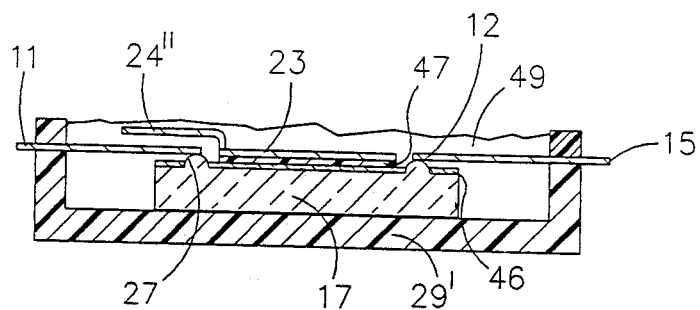
FIG. 11 is a schematic representation of a molded plastic package using the present invention.

Another embodiment of the present invention is illustrated in FIG. 11. The interconnect tape and thermal dissipation pad are incorporated into a molded plastic package. The plastic package contains a molded base component 29' to which a semiconductor device 17 is affixed. The interconnect tape has inner lead portions 12 affixed to bonding sites 27 on the semiconductor chip and outer lead portions 15 which pass through and are molded into the base. The heat dissipating pad 23 is affixed to the semiconductor device with an adhesive layer 47. The heat dissipating support members 24" are fashioned to lack coplanarity with the leads. The lack of coplanarity prevents an electrical short circuit. After the leads and heat dissipating pad are properly positioned within the package base, the base cavity is filled with a resin 49 which is cured to form a solid plastic block to protect the electronic device from the environment and the leads from vibrations. The resin fills the gap between the leads and the heat dissipating supports to insure electrical isolation.

Figure 12:
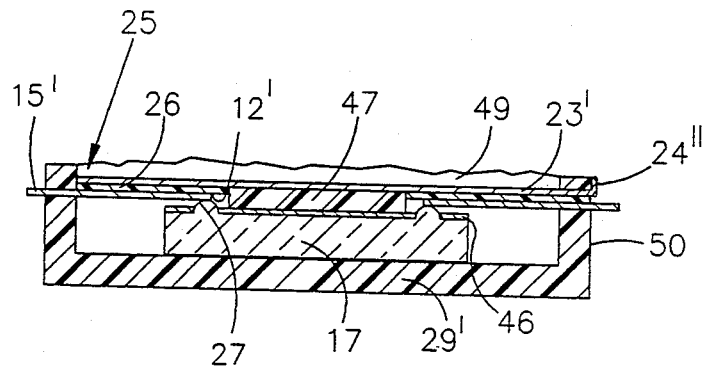
FIG. 12 is another embodiment of a plastic package using the present invention.

Another embodiment of the plastic package is shown in FIG. 12. The interconnect tape is a three layer laminate 25 with first and second copper layers separated by an insulating-polyimide layer. The first copper layer is formed into leads with inner lead portions 12' contacting the silicon chip at bonding bumps 27 and outer lead portions 15' extending through and molded into the package base. The middle layer of the interconnect tape is the insulating layer 26. The second copper layer 23' is the heat dissipating pad. Because it is electrically isolated from the leadframes, the heat dissipating pad can extend over the entire inner surface area of the package greatly increasing the thermal dissipation abilities of the package. There is nothing limiting the dimensions of the heat dissipating pad 23' to the dimensions of the package. It may extend beyond the package walls to increase convective cooling or for connection to an external heat sink device.

Figure 13:
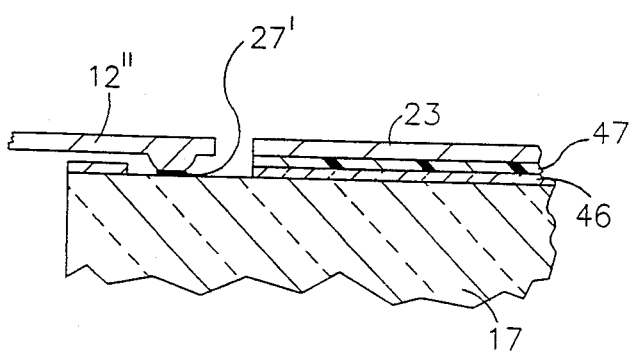
FIG. 13 is a cross-sectional representation of an embodiment with bumped TAB leads.

While the examples and embodiments shown hereinabove illustrate an electronic device with bumped electrical contacts, it is recognized that bumped inner leads and smooth electrical contacts on a semiconductor die may be used. FIG. 13 shows, in cross-section, a configuration of the bumped inner leads 12" and smooth bonding site 27'. Generally, the bumped inner lead is plated to limit copper diffusion and the smooth bonding site is coated with aluminum to facilitate bonding.

Figure 1:
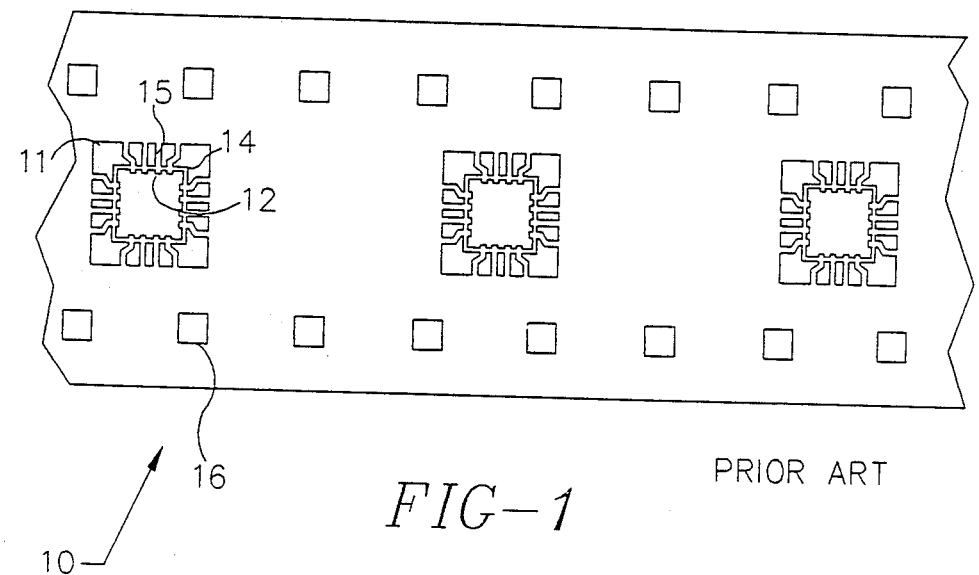
FIG. 1 is a schematic representation of an interconnect tape as known in the prior art.

The TAB process has the ability to precisely align lead fingers to facilitate automated bonding. Referring back to FIG. 1, one conventional indexing means uses the index holes 16 to accurately position the lead fingers 12 over the bonding sites on a silicon chip, not shown. Other embodiments use indexing means not incorporated into the index holes.

Figure 14:
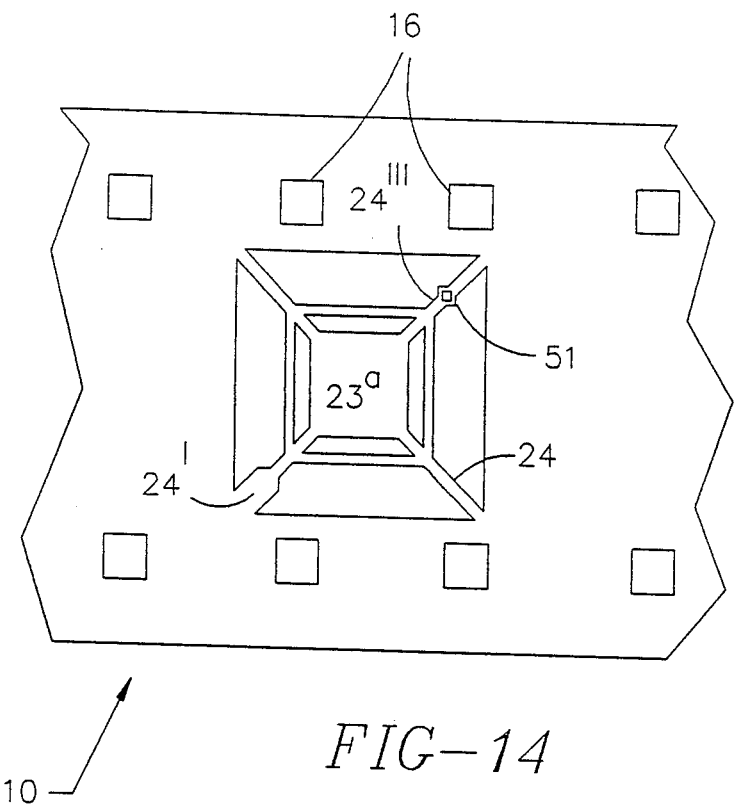
FIG. 14 is a schematic representation of a leadless tape for transporting and positioning the heat dissipating pad.

FIG. 14 shows a leadless TAB tape 10 for transporting and positioning the heat dissipating pad 23$^a$. A semiconductor die has previously been electrically connected to a leadframe either through the use of TAB tape bonding or by conventional wire bonding. Using the index holes 16 or another indexing means, the heat dissipating pad is positioned over the semiconductor chip. The heat dissipating pad is electrically isolated from the leads by a dielectric adhesive. The dielectric adhesive may be applied to the semiconductor chip prior to placement of the heat dissipating pad or in the alternative, applied to the face of the heat dissipating pad prior to placement over the semiconductor chip.

As disclosed hereinabove, the heat dissipating pad is bonded to the semiconductor package through support means 24. The heat dissipating pad is ideally as thick as possible to enhance conduction of heat away from the active face of the semiconductor chip. To minimize stress induced by differences of the coefficient of thermal expansion, stress relief patterns may be etched into the heat dissipating pad as shown above in FIG. 8.

Stress relief patterns may also be incorporated into the support member 24''' as shown in FIG. 14. The use of stress relief patterns in TAB bonding leads is known as in U.S. Pat. No. 4,234,666. Stress relief patterns in the support members are configured to support the heat dissipating pad and dampen thermal expansion and contraction stresses. The stress relief cutouts 51 may be any size and shape which supplies adequate support.

Figure 15:
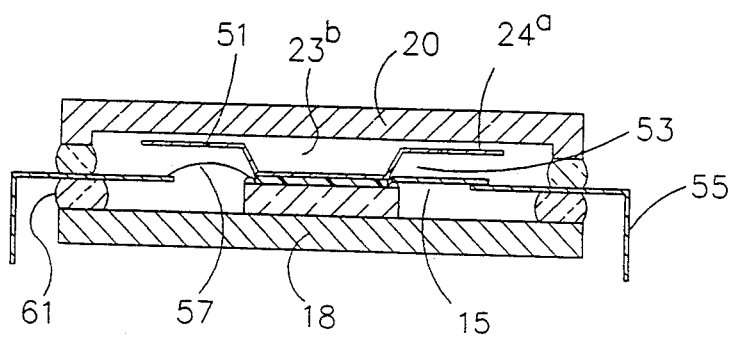
FIG. 15 is a cross-sectional representation of a heat dissipating pad downset to prevent contact with the semiconductor leads.

As shown in FIG. 15, the support members 24$^a$ need not be straight but may contain a downset 53. The downset is typically positioned between the stress relief site and the heat disipating pad 23$^b$ and electrically isolates the heat dissipating pad from the TAB leads 15 or wire bonds 57. Additionally, as the support means are not in the same plane as the heat dissipating pad, thermally induced stresses will not be applied directly to the electronic device.

A metal or metal alloy leadframe 55 may be disposed between the base component 18 and the cover component 20. The leadframe is held in place and electrically isolated from the base component by use of a dielectric adhesive 61. The adhesive is typically a sealing glass or a polymer for example, an epoxy. The leadframe is electrically connected to the semiconductor chip by TAB leads 15 or by conventional wire bonding 57.

The use of two TAB tapes, a first for lead fingers and a second for the heat dissipating pads may be applied to any of the package configurations described hereinabove, including a metal package or a plastic encapsulated package. All other embodiments disclosed for the single tape embodiment may likewise be applied to the dual tape embodiments.

Conventional wire bonding may be used to electrically connect the chip to a leadframe and a single transport tape used to align the heat dissipating pad.

It is apparent that in accordance with this invention, it is possible to configure a tape interconnect with a thermal dissipation pad in contact with the heat generating top face of an electronic device, thereby greatly improving the heat dissipating characteristics of a package assembled from the interconnect tape.

The patents and publications set forth in this specification are intended to be incorporated by reference herein.

It is apparent that there has been provided in accordance with this invention, an improved interconnect tape for use in tape automated bonding which fully satisfies the objects, means, and advantages set forth hereinbefore. While the invention has been described in combination with specific embodiments thereof, i is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. A package enclosing an electronic device, said electronic device containing electrically active bonding sites on a heat generating face, comprising:
    a base component;
    a cover component;
    a leadframe disposed between said base component and said cover component;
    a means electrically connecting said electronic component to said leadframe;
    a head dissipating pad adhesively affixed to said electrically active face of said electronic device said heat dissipating pad additionally containing at least one outwardly extending expandable support member;
    a first dielectric sealing compound disposed between said base component and said leadframe; and
    a second dielectric sealing compound disposed between said leadframe and said cover component.

2. The package of claim 1 in which the means electrically connecting said electronic component to said leadframe is an electrically conductive wire.

3. The electrically conductive wire of claim 2 in which said wire is comprised of aluminum or gold.

4. The package of claim 1 in which the means electrically connecting said electronic component to said leadframe is a conductive tape adapted for tape automated bonding.

5. The package of claim 1 in which the adhesive affixing said heat dissipating pad to said electronic component is electrically conductive.

6. The package of claim 5 in which said adhesive is filled with a thermally conductive metal powder.

7. The package of claim 1 in which said adhesive is electrically nonconductive.

8. The package of claim 7 in which said nonconductive adhesive is a compliant polymer.

9. The package of claim 1 in which said base component is selected from metals, ceramics or polymers.

10. The package of claim 9 in which said base component is comprised of copper or a copper based alloy.

11. The package of claim 9 in which said base component is comprised of a thermosetting epoxy.

12. The package of claim 1 in which said cover component is selected from metals, ceramics or polymers.

13. The package of claim 12 in which said base and cover components are comprised of the same material.

14. The package of claim 1 in which said first and second dielectric sealing compounds are glasses or polymers.

15. The heat dissipating pad support of claim 1 further containing stress relief patterns.

16. The heat dissipating pad support of claim 1 further containing a downset.

17. The heat disipating pad support of claim 1 in which said outwardly extending end of said support is bonded to said base component or cover component.

18. The heat disipating pad support of claim 17 in which said outwardly extending end of said support is expanded to maximize thermal dissipation.

19. The heat disipating pad support of claim 1 in which said outwardly extending end of said support extends beyond the base component and the cover component.

20. The heat dissipating pad support of claim 1 in which said outwardly extending end said support is bonded to an external heatsink.

21. The package of claim 1 in which said base component and said cover component comprise a unitary member.

22. The package of claim 21 in which said base component and said cover component are comprised of a molded polymer.

23. The package of claim 22 in which said molded polymer is a thermosetting epoxy.

* * * * *